(12) United States Patent
Cooke et al.

(10) Patent No.: US 10,101,470 B2
(45) Date of Patent: Oct. 16, 2018

(54) LASER ETCHED SCINTILLATION CRYSTALS FOR INCREASED PERFORMANCE

(71) Applicant: KONINKLIJKE PHILIPS N.V., Eindhoven (NL)

(72) Inventors: Steven E. Cooke, Garfield Heights, OH (US); Joseph Lee Molyneux, Painesville, OH (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 94 days.

(21) Appl. No.: 14/915,405

(22) PCT Filed: Sep. 10, 2014

(86) PCT No.: PCT/IB2014/064388
§ 371 (c)(1),
(2) Date: Feb. 29, 2016

(87) PCT Pub. No.: WO2015/040527
PCT Pub. Date: Mar. 26, 2015

(65) Prior Publication Data
US 2016/0209517 A1 Jul. 21, 2016

Related U.S. Application Data

(60) Provisional application No. 61/879,269, filed on Sep. 18, 2013.

(51) Int. Cl.
*G01T 1/20* (2006.01)
*G06F 17/50* (2006.01)
*H01L 27/146* (2006.01)

(52) U.S. Cl.
CPC .......... *G01T 1/2018* (2013.01); *G01T 1/2002* (2013.01); *G06F 17/5068* (2013.01); *H01L 27/14663* (2013.01); *H01L 27/14685* (2013.01)

(58) Field of Classification Search
CPC .................................................... G01T 1/2018
See application file for complete search history.

(56) References Cited

U.S. PATENT DOCUMENTS

| 4,717,645 A | 1/1988 | Kato |
| 5,778,291 A | 7/1998 | Okubo |

(Continued)

FOREIGN PATENT DOCUMENTS

| DE | 102008057079 | 5/2010 |
| JP | 2000155200 | 6/2000 |

(Continued)

OTHER PUBLICATIONS

Moriya et al., JP 2009-270971 A, English Translation, 12 Pages, Advanced Industrial Property Network (AIPN), Japan Patent Office, obtained on May 8, 2018.*

(Continued)

*Primary Examiner* — David P Porta
*Assistant Examiner* — Jeremy S Valentiner

(57) ABSTRACT

A detector array for an imaging system includes an array of scintillator crystals (12), wherein each crystal includes a plurality of sides and is laser etched on at least one crystal side to scatter light, and an array of photodetectors (18) optically coupled to array of scintillator crystals. The side of the crystal (12) is laser etched with a distinct pattern defined by a user using a computer aided design program. The detector (6) is part of a nuclear scanner (4) which includes a reconstruction processor (8) that reconstructs output sig- (Continued)

nals from the photodetectors (18) into an image and a user interface (10) that displays the reconstructed image.

19 Claims, 6 Drawing Sheets

(56) References Cited

U.S. PATENT DOCUMENTS

| | | | |
|---|---|---|---|
| 5,968,374 A | 10/1999 | Bullock | |
| 6,921,909 B2* | 7/2005 | Nagarkar | G21K 4/00 250/363.01 |
| 9,691,150 B2 | 6/2017 | Miyasa | |
| 9,709,684 B2* | 7/2017 | Kim | G01T 1/1644 |
| 2004/0262526 A1* | 12/2004 | Corbeil | G01T 1/20 250/367 |
| 2005/0065049 A1 | 3/2005 | Burdo | |
| 2009/0134334 A1* | 5/2009 | Nelson | G01T 1/2002 250/361 R |
| 2010/0270463 A1* | 10/2010 | Lee | G01T 1/2002 250/252.1 |
| 2012/0235047 A1* | 9/2012 | Lewellen | A61B 6/037 250/366 |
| 2013/0314147 A1 | 11/2013 | Shimizu | |

FOREIGN PATENT DOCUMENTS

| | | | |
|---|---|---|---|
| JP | 2009270971 A * | 11/2009 | G01T 1/202 |
| WO | 0150508 | 7/2001 | |
| WO | 2006/107727 | 10/2006 | |
| WO | 2011/056660 | 5/2011 | |
| WO | 2012/105292 | 8/2012 | |
| WO | 2012153223 | 11/2012 | |

OTHER PUBLICATIONS

Moriya, et al., "Development of PET Detectors Using Monolithic Scintillation Crystals Processed with Sub-Surface Laser Engraving Technique", IEEE Transactions on Nuclear Science, vol. 57, No. 5, Oct. 1, 2010.

* cited by examiner

LASER ETCHED SCINTILLATION CRYSTALS FOR INCREASED PERFORMANCE

CROSS REFERENCE TO RELATED APPLICATIONS

This application is the U.S. National Phase application under 35 U.S.C. § 371 of International Application No. PCT/IB2014/064388, filed Sep. 10, 2014, published as WO 2015/040527 on Mar. 26, 2015, which claims the benefit of U.S. Provisional Patent Application No. 61/879,269 filed Sep. 18, 2013. These applications are hereby incorporated by reference herein.

The present application finds particular application in positron emission tomography (PET) imaging systems. However, it will be appreciated that the described technique may also find application in single photon emission computed tomography (SPECT) and other diagnostic systems, other imaging systems, or other imaging techniques.

PET, SPECT, and other radiation-based medical imaging modalities share a common need for compact and robust radiation detector modules. In the past, SPECT and PET radiation detector modules have typically included an array of photomultiplier tubes (PMTS) optically coupled with scintillator crystals using an intermediate light guide layer. The scintillator crystal converts the absorbed radiation particle into a light burst which is detected and localized by the photomultiplier tubes using Anger logic. In some radiation detection systems, the photomultiplier tubes have been replaced by photodiodes that produce an analog signal proportional to the intensity of the light bursts. Photodiodes offer a cost-effective, low voltage alternative to photomultiplier tubes in high light situations. Silicon photomultipliers (SiPM) detectors have been developed which incorporate the high gain and stability of photomultiplier tubes along with the cost-effective, low voltage nature of the analog photodiodes.

Current PET systems are built from arrays of LYSO (lutetium-yttrium oxy-orthosilicate) crystals covered individually with polytetrafluoroethylene (PTFE) tape to reflect light back into the crystal and prevent optical loss and crosstalk between crystals.

Increasing the light output of scintillating crystals has been tried using different surface treatments. Etching crystal with acid has been tried with poor results. Grinding crystals increases the light output. However, it is difficult to control the actual roughness of the crystals because the grit changes over time as more and more crystals are ground using the same grit or slurry. LYSO is hard compared to some grinding grits. Grinding only one side is difficult because the machines used for grinding crystals typically grind two opposing sides at one time. Grinding degrades time of flight (TOF) timing of the crystals. Grinding removes expensive material from the crystals and reduces the sensitivity of the crystals. There is a need to increase light output while maintaining timing.

In accordance with one embodiment, a detector array for an imaging system, including: an array of scintillator crystals, wherein each crystal includes a plurality of sides and is laser etched on at least one crystal side to scatter light, and an array of photodetectors optically coupled to array of scintillator crystals.

In accordance with one preferred method of the present application, a method, comprising: laser etching at least one side of each of a plurality of polished scintillator crystals; arranging the scintillator crystals in an array; and optically coupling a plurality of photodetectors to the plurality of scintillator crystals.

In accordance with another embodiment, a nuclear scanner, comprising: a plurality of scintillator crystals coupled to a plurality of photodetectors, the scintillator crystals having at least one surface with a patterned marking to diffuse light; a reconstruction processor for reconstructing output signals from the plurality of photodetectors into an image; and a user interface for displaying information to a user.

One advantage of the present application is that there is no loss of material when using a laser etching process.

Another advantage of the present application is that the light output is increased.

Another advantage of the present application is that the time of flight timing is maintained.

One further advantage is that the laser etching process allows a variety of patterns to be etched into the scintillator crystal.

Other advantages will become apparent to those of ordinary skill in the art upon reading and understanding the following description.

The drawings are for illustrative purposes only and should not be construed as limiting the claims.

The present application provides for a system and apparatus for laser etched scintillator crystals. When all of the sides of a scintillator crystal are mirror-reflective, light can become trapped bouncing back and forth or among the side walls, and not exit the scintillator or exit gradually over an extended time, e.g. a relatively low amplitude, long time duration pulse. For example, light can become trapped in the resulting reflector structure when employing mirror reflectors with rectangular crystals. In such cases, only a fraction of the photons generated in the crystal are transmitted into the detector that is optically coupled to the bottom surface of the scintillator which is not covered by the reflector. A major part of the light can be "infinitely" reflected on helical trajectories between the other five of the six surfaces of the crystal, due to total reflection inside the crystal (n=1.82). The subject innovation overcomes the aforementioned problems by etching a pattern onto one or more surfaces of a scintillator crystal used in a PET detector scintillation crystal array.

Figure 1:
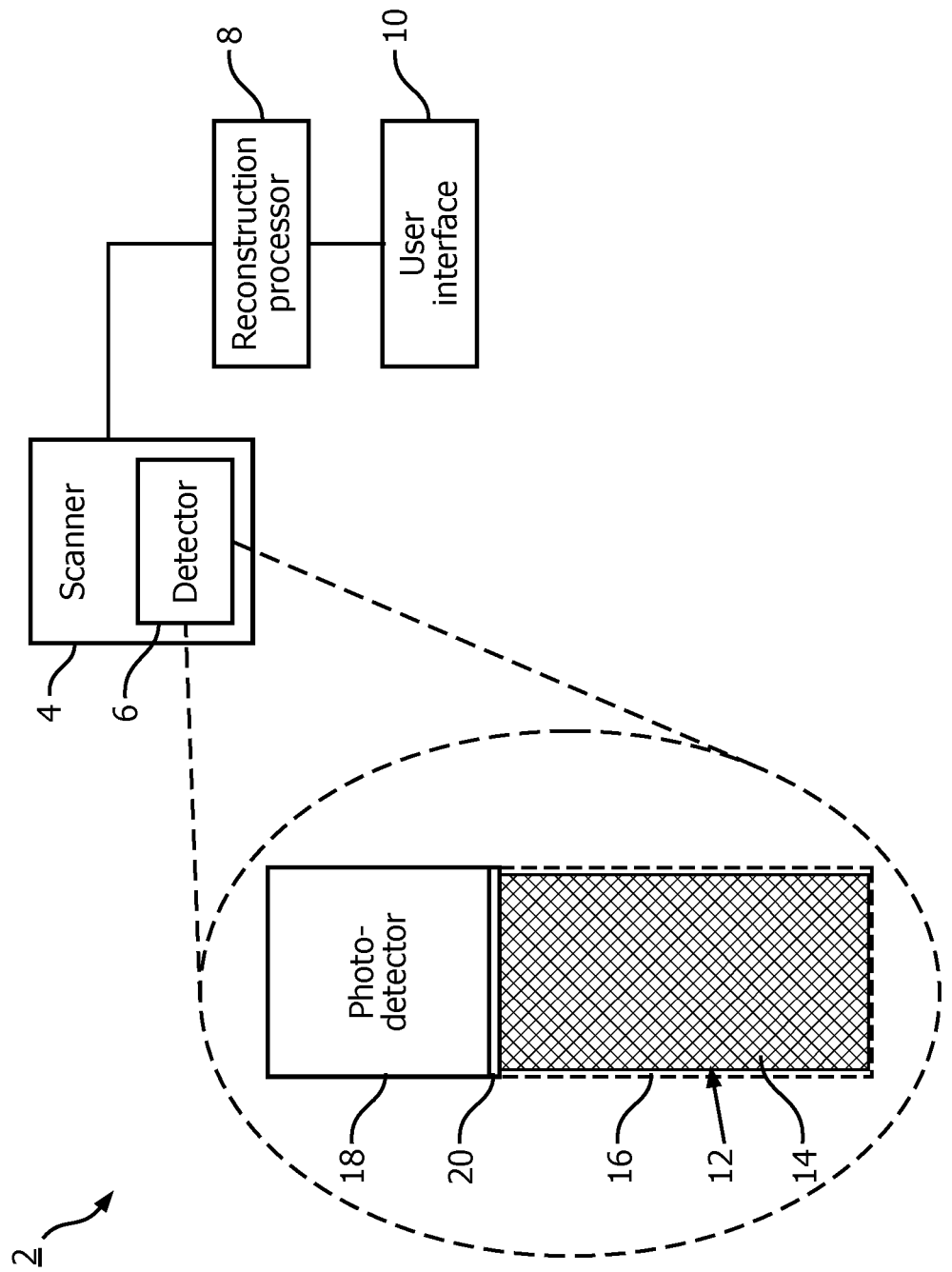
FIG. 1 depicts an imaging system with etched scintillator crystals.

FIG. 1 illustrates an imaging system 2. The imaging system 2 includes a scanner 4 for scanning a patient using one of PET, SPECT, multi-modal, and the like. The scanner 4 includes a detector 6 to detect imaging radiation events of the patient. The imaging system 2 includes a reconstruction processor 8 to reconstruct imaging events from the detector 6 into images of the patient. The reconstructed images are displayed to a user using a user interface 10 of the imaging system 2. The detector 6 includes a scintillator crystal 12 that is laser etched with a user defined pattern 14.

The scintillator crystal 12 is etched with a laser that creates a series of microfractures just underneath and/or on the surface of the crystal 12. The microfractures from the laser are able to scatter light back into the crystal at diffuse angles as the light attempts to escape the crystal through the one side. In one embodiment, the crystal 12 is etched using a sub-surface laser engraving technique where the laser is focused underneath the crystal surface to create microfractures underneath the crystal surface.

Each scintillator crystal 12 is covered in a diffuse reflective layer 16, such as PTFE. Optionally, an outer layer of light blocking material, such as polished metal foil, can surround the PTFE layer. Individual etched crystals are optically coupled to individual photodetectors 18, such as a photodiode, avalanche photodiodes (APDs), silicon photomultipliers (SiPMs), photomultiplier tubes, and the like. The crystal 12 and photodetector 18 combination is arranged in an array crystal/photodetector combinations. The photodetectors 18 may be coupled 1:1 to the scintillators; as well as plural:1, 1:plural, and plural:plural. The array registers scintillation events in the crystals and transmits scintillation event data to the detector module for further transmission to the reconstruction processor 8 for storage and reconstruction into an image of the patient. In one embodiment, the scintillator crystal 12 is optically coupled with the photodetector 18 via a light guide 20.

When radiation, such as a gamma photon, enters a scintillation crystal, it interacts with the crystal casing and is either internally reflected by or escapes through the sidewalls of the crystal. Etching a pattern onto one or more surfaces (e.g., top, bottom, or a side) reduces the trapping of optical photons between opposite reflector structures. While the light output of scintillator crystals with surrounding reflectors decreases strongly with increasing crystal length, the etching of one side surface increases the light output of long (e.g., having an aspect ratio of approximately 1.5:1 or greater, 2.5:1 or greater, 3.5:1 or greater, etc.) crystals, up to a value achievable with much shorter crystals. Longer crystals have more radiation-stopping capacity and are particularly advantageous for high energies, such as those employed in PET.

The diffuse reflector layer 16, in one embodiment, includes a specular reflector of multiple layers, e.g., 40-100 layers in one embodiment, each of very thin polymer materials with different indices of refraction. When working with, for instance, LYSO crystals that have a peak light output at 430 nm, the specular reflector is optimized to reflect light in the 400-550 nm range. In other embodiments, the specular reflector is optimized to reflect light in a range that encompasses a peak light output of a particular crystal being employed.

In one embodiment, the specular reflector is a high reflectivity, mirror-like optical enhancement film applied around the crystal 12. In another embodiment, the specular reflector includes a plurality of alternating layers of different materials, each of the different materials having a different angle of reflection. In another embodiment, the reflector layer optimizes the refracture index of the crystal/reflector interface to maximize total internal reflection in the crystal.

Figure 2:
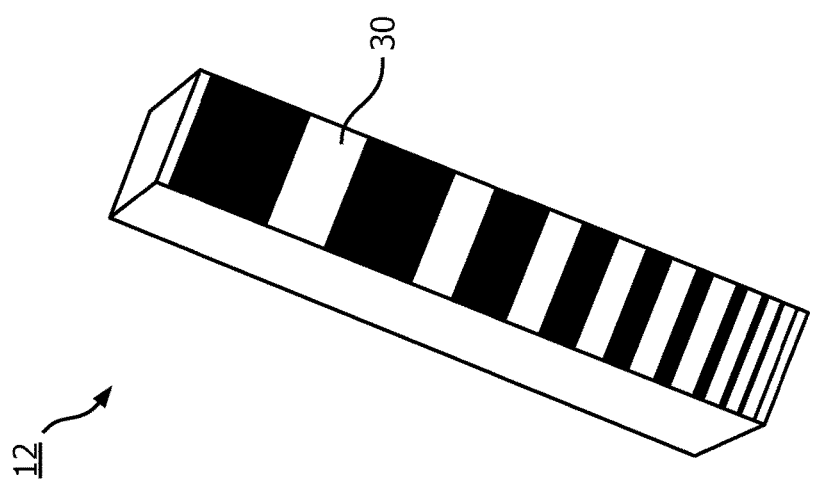
FIG. 2 depicts three-dimensional view of a scintillator crystal with one side etched with a progressive pattern.

In the embodiment of FIG. 2, a progressive pattern 30 is etched onto one side of the scintillator crystal 12. The progressive pattern 30 shows the laser etched parts as darkened areas and the light parts of the crystal are left in the polished state like the other faces. The progressive pattern 30 cannot readily be achieved through grinding or other methods and processes due to the significant portions of the crystal 12 side left untouched.

Figure 3:
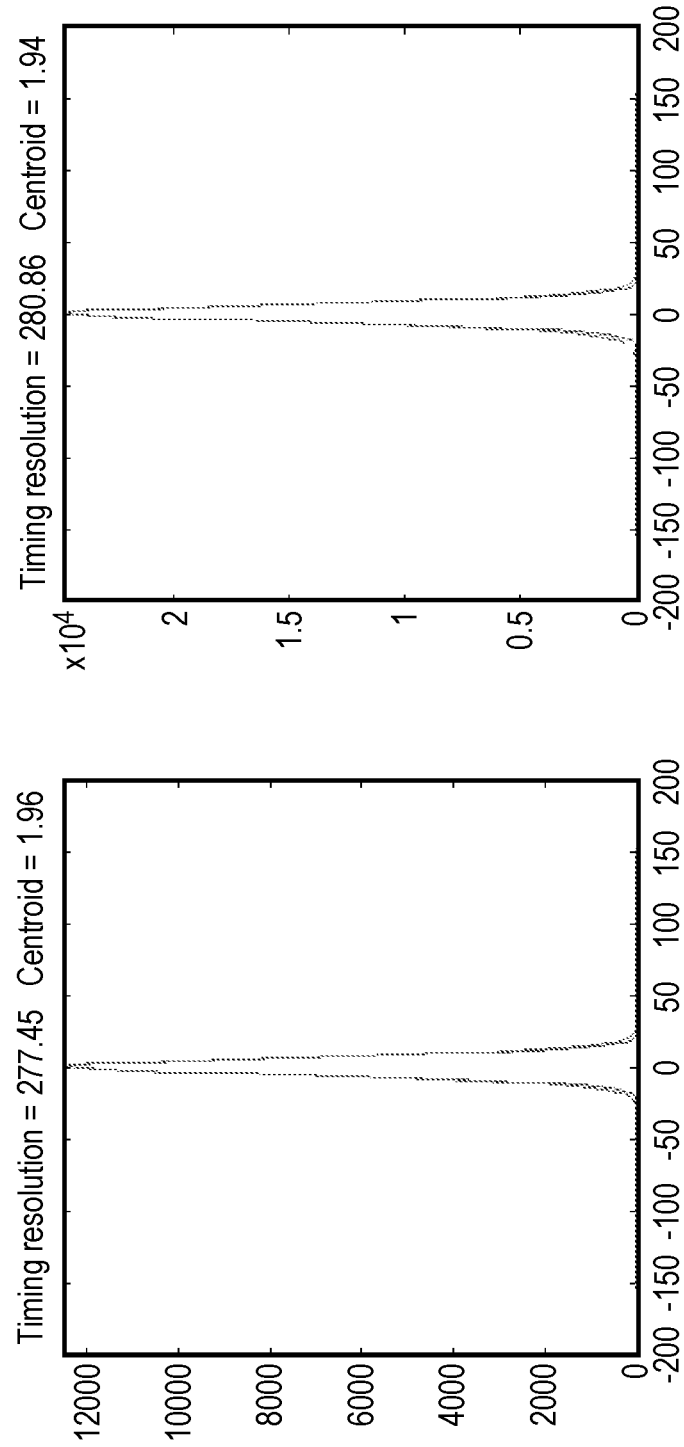
FIG. 3 depicts a side-by-side comparison of timing resolutions for an etched scintillator crystal (left) and a non-etched scintillator crystal (right).

With respect to FIG. 3, graphs which depict light output vs. time are presented. A side-by-side comparison of the timing resolution graphs for a progressive pattern etched crystal (LEFT) versus an non-etched polished crystal (RIGHT) is presented. From the graphs, it can be seen that the progressive pattern etched crystal provides an improved timing resolution over polished crystals. The narrower pulse on the left reflects a 3 picosecond timing improvement over non-etched crystals (RIGHT).

Figure 4:
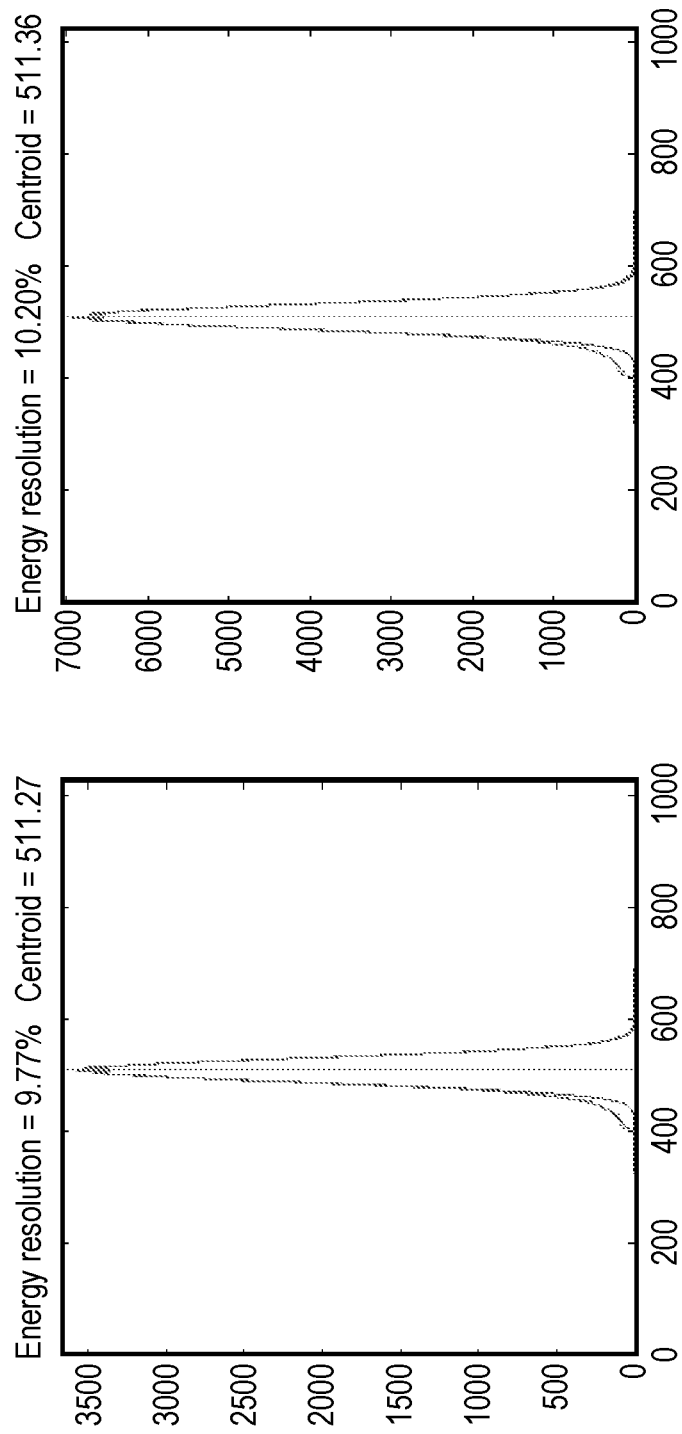
FIG. 4 depicts a side-by-side comparison of energy resolutions for an etched scintillator crystal (left) and a non-etched scintillator crystal (right).

With respect to FIG. 4, the graphs depict an energy distribution of a large number of received 511 key gamma photons. A side-by-side comparison of the energy resolution graphs for a crystal with on side having a progressive pattern (LEFT) versus a non-etched polished crystal (RIGHT) is presented. From the narrower peak it can be seen that the progressive pattern etched crystal (LEFT) provides an improved energy resolution over polished crystals (RIGHT). The graph shows a 40% energy improvement over non-etched crystals (RIGHT).

Figure 8:
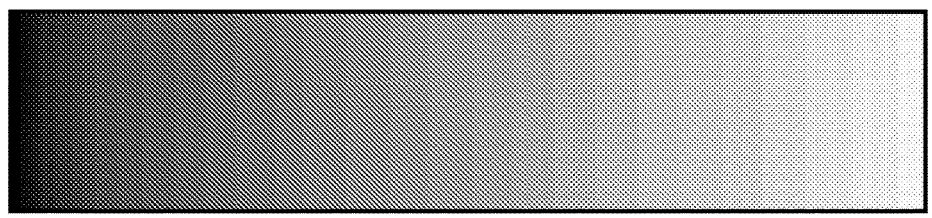
FIG. 8 depicts a gradient pattern etched into a scintillator crystal.
Figure 7:
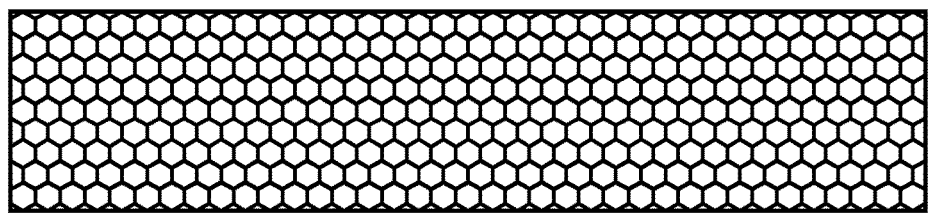
FIG. 7 depicts a honeycomb pattern etched into a scintillator crystal.
Figure 6:
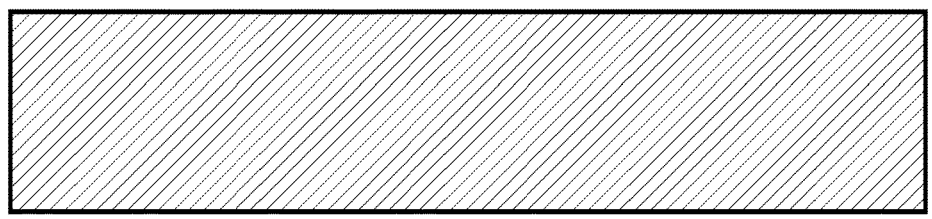
FIG. 6 depicts a diagonal pattern etched into a scintillator crystal.
Figure 5:
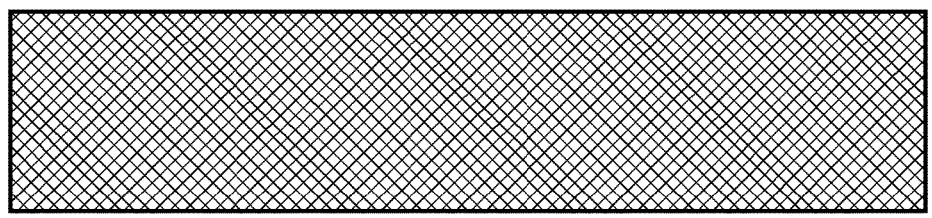
FIG. 5 depicts a cross-hatch pattern etched into a scintillator crystal.

Various defined patterns can be etched into the scintillator crystal 12. The user can create a pattern using computer aided design (CAD) software. With respect to FIG. 5, a cross-hatch pattern is shown where the darkened areas signify the etched parts (user defined pattern 14) of the crystal surface. With respect to FIG. 6, an alternating diagonal pattern is shown where etched diagonal lines alternate with non-etched polish crystal lines. With respect to FIG. 7, a honeycomb pattern is shown. With respect to FIG. 8, a gradient pattern is shown where the etching intensity is gradually reduced from one end to another. The laser is capable of varying intensities and sweep speed or dwell time of the laser beam which affect the amount of light that is diffusely reflected by the etched side. It is appreciated that many more patterns can be designed using a CAD program and etched into the scintillator crystal 12.

The scintillator crystal 12 includes a top, bottom, and four sides. One or more sides of the scintillator 12 crystal are etched with a pattern by a laser. A laser etching system includes a controller for controlling the laser, and a powered laser to etch material. The laser used to laser etch the crystal is selected and adjusted such that the power of the laser creates the microfractures in the crystal without breaking the crystal to be etched. The laser provides significant control over the laser etching process. The pattern 14 is achieved by the laser through the use of a design program. A user specifies a pattern to be laser etched on the crystal using the design program such as CorelDraw™ and the like. The program creates a file for the pattern and uploads it to a controller of the laser system. The laser system uses the file and etches the pattern into the crystal with a laser beam. The speed, output power and frequency of the laser can be user-defined, which offers greater control over change in the surface treatment which affects the amount of light scattered back into the crystal. This provides significant control over the process which grinding does not. It will be appreciated that the etched surface is not limited to being a side surface but rather may be a top or bottom surface.

In one embodiment, the scintillation crystal is Lutetium Yttrium Oxy-Orthosilicate (LYSO). Other scintillators such as Lutetium Oxy-Orthosilicate (LSO), Lutetium Gadolinium Oxy-Orthosilicate (LGSO), Lutetium Gadolinium Yttrium Oxy-Orthosilicate (LGYSO), or the like are also contemplated. A less dense scintillator such as Lanthanum Bromide (LaBr), or a higher density scintillator such as a Bismuth Germanate (BGO) scintillator can be employed as well.

The etched crystal 12 is employed in an array of similar crystals, such as in a functional scanner detector. In general, crystal length is a function of scintillation material stopping power. For instance, when using a LYSO scintillation material for PET, 10-25 mm long crystals may be employed. When using a LaBr scintillation material, 20-35 mm crystals may be employed. In another example, 5-20 mm long crystals are employed when a BGO scintillation material is used. It will be appreciated that the foregoing examples of crystal lengths are illustrative in nature, and intended to illustrate that as scintillator stopping power increases, the crystal length can be decreased.

In one embodiment, the crystals are polished smooth and then etched on one side. In another embodiment, the crystals are polished smooth and arranged in an array. Once positioned in the array, the top surfaces or bottom surfaces of all crystals can be etched. For example, portions of one or more of the illustrated laser etching patterns can be distributed over two or more sides of the crystal.

In another embodiment, the PET scanner is a time-of-flight (TOF) PET scanner. TOF PET imaging takes advantage of the small time difference between receipt of the gamma photons from a common annihilation event by a pair of detector elements to further localize the positron-electron annihilation event along the line-of-response (LOR) defined between the receiving detectors. In general, the annihilation event occurred along the LOR at a point closer to the gamma ray detection event that occurred first. If the two gamma ray detection events occur simultaneously within the time resolution of the detectors, then the annihilation event most probably occurred at the midpoint of the projection. The laser etched crystals, as opposed to ground crystals, increases the light output without degrading the TOF timing important to a TOF PET scanner.

In another embodiment, the functional scanner is a single photon emission computed tomography (SPECT) scanner. In SPECT imaging, one or more radiopharmaceuticals or radioisotopes are administered to the imaged subject such that emission radiation is emitted therefrom, as discussed above. Detector heads mounted to a rotating gantry are rotated around the subject to detect radiation from a plurality of directions, each direction being defined by a collimator that is coupled to the detector head. The detector heads may rotate around the imaging subject in a revolution taking scans at multiple discrete or continuous locations along revolution. Alternatively, the detector heads may rotate over a smaller arc or make multiple revolutions around the subject. The emission data, projection data or measured sinogram received by the detector heads is reconstructed to generate a SPECT image. Reconstruction techniques employed to reconstruct the emission data may include without limitation iterative reconstruction, Fourier transform-based reconstruction, filtered back projection, or some other suitable reconstruction technique.

In another embodiment, the functional scanner (SPECT, PET, variants thereof, etc.) is included in a multi-modal scanner device that includes the functional scanner and an additional imaging device, such as a magnetic resonance (MR) imager, a computed tomography (CT) scanner, or the like.

Additionally, it will be appreciated that the scanner detectors (PET, SPECT, etc.) in which the scintillation crystals are employed are solid state detectors, in accordance with one or more embodiments described herein.

Figure 9:
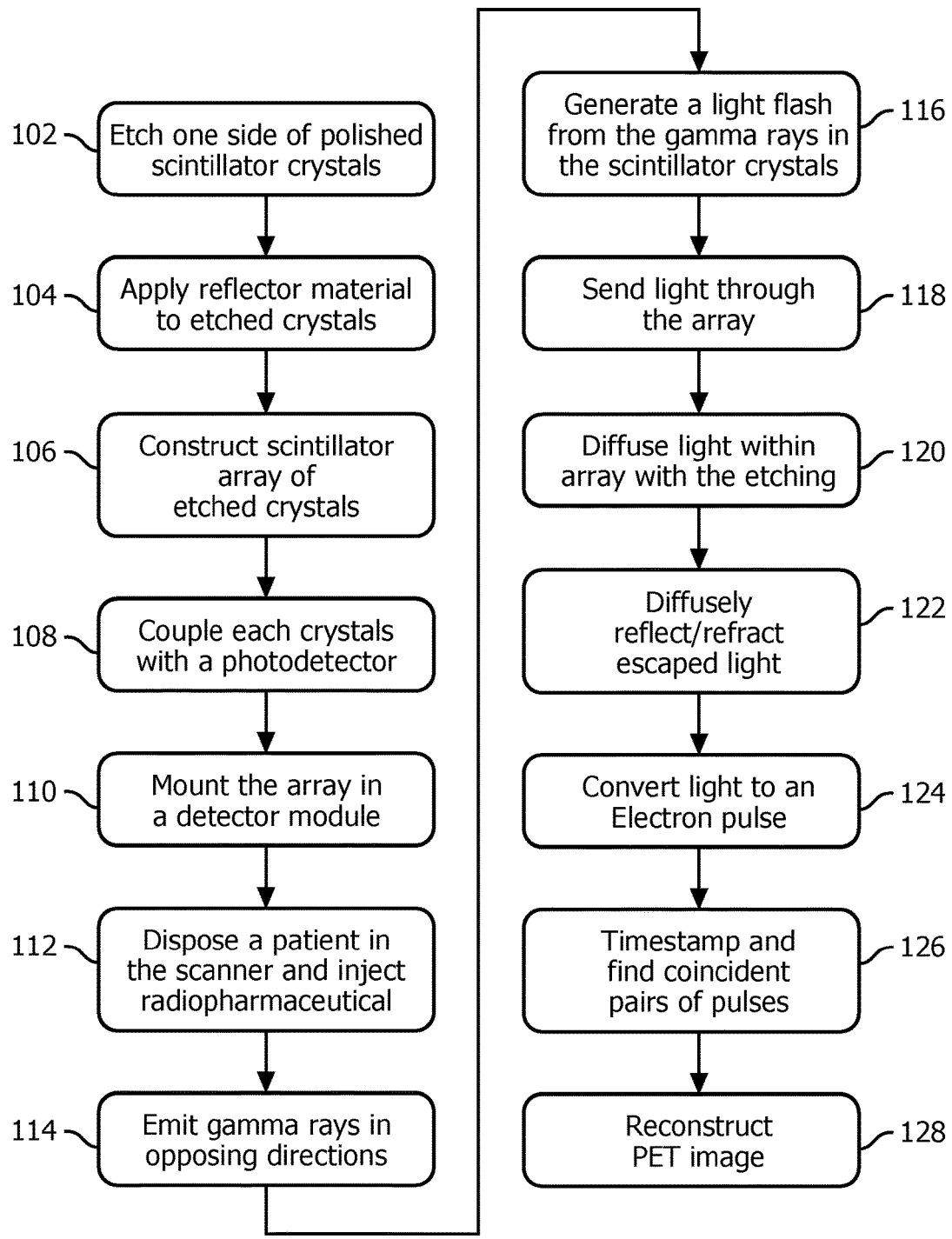
FIG. 9 depicts a method for constructing a detector array with laser etched crystals.

With respect to FIG. 9, a method for constructing a detector array with laser etched crystals is depicted. At a step 102, one side of polished scintillator crystals are laser etched with a selected pattern. At a step 104, a reflector material is applied around each crystal to further reflect light into the crystal and hinder cross talk between crystals. At a step 106, an array of scintillator crystals is constructed. At a step 108, each crystal is optically coupled to a photodetector. At a step 110, the coupled array is mounted into a detector module for use in the imaging system.

When using the system in a PET diagnostic examination, the patient is disposed in the scanner and injected with a radiopharmaceutical in a step 112. As the radioisotope moiety of the radiopharmaceutical decays, it causes a pair of 511 keV gamma rays to be emitted in diametrically opposing directions in a step 114. The gamma rays interacts with a corresponding scintillator crystal and generates a scintillation or light flash, of characteristic energy at a step 116. At a step 118, the light from each scintillation crystal travels through the corresponding scintillator crystal. At a step 120, photons within the scintillator crystal is, in part, diffused and scattered by the laser etchings, in part, concurrently reflected form the polished faces. Light which escapes the scintillation crystal is diffusely reflected by the diffuse reflector layer 16 and/or reflected by a specular reflector surrounding the diffuse reflector layer at a step 122. At a step 124, light which is refracted, reflected, or passes directly to the light guide 20, is converted by the photodetector to an electron pulse by the photodetector 18. The electric pulses are time stamped and the time stamps are compared to find coincident pairs that define an LOR at a step 126. The reconstruction processor 8 reconstructs the LOR into the diagnostic PET image in a step 128.

Although the system and method of the present disclosure have been described with reference to exemplary embodiments thereof, the present disclosure is not limited to such exemplary embodiments. Rather, the system and method disclosed herein are susceptible to a variety of modifications, enhancements and/or variations, without departing from the spirit or scope hereof. Accordingly, the present disclosure embodies and encompasses such modifications, enhancements and/or variations within the scope of the claims appended hereto.

The invention claimed is:

1. A detector array for an imaging system, including:
   an array of scintillator crystals,
   wherein each scintillator crystal includes a plurality of side surfaces,
   wherein at least a portion of at least one scintillator crystal side surface is configured by laser etching of the at least one scintillator crystal side surface with microfracture regions of different sizes to diffusely reflect light back into the at least one crystal,
   wherein each microfracture region is adjacent to at least one microfracture-free region of the at least one scintillator crystal side surface; and
   an array of photodetectors optically coupled to the array of scintillator crystals.

2. The scintillator array according to claim 1, wherein the microfracture regions are progressively larger from one end to an opposite end of the side surface.

3. The detector array according to claim 1, wherein the at least one laser etched side surface of the crystal is a long side of the crystal, the long side extending between a radiation receiving side through which radiation is received and a light output side that is optically coupled to the photodetector.

4. The detector array according to claim 3, wherein the at least one etched surface of the crystal is laser etched with progressively larger microfracture regions between the light output side and the radiation receiving side.

5. The detector array according to claim 3, wherein each microfracture region includes a plurality of laser etched microfractures, and wherein the at least one scintillator crystal side surface has more laser etched microfractures adjacent the radiation receiving side of the scintillator crystal and fewer laser etching microfractures adjacent the light output side of the scintillator crystal.

6. The detector array according to claim 1, wherein only a single side surface of each scintillator crystal is laser etched.

7. The detector array according to claim 1, wherein each scintillator crystal is covered with a diffuse reflector coating.

8. The detector array according to claim 1, wherein the photodetectors include silicon photodiodes (SiPMs).

9. A nuclear scanner comprising:
a plurality of the detector arrays according to claim 1;
a reconstruction processor that reconstructs output signals from the photodetectors into an image; and
a display device that displays the reconstructed image.

10. The detector array according to claim 1, wherein the microfracture regions alternate with the microfracture-free regions.

11. The detector array according to claim 1, wherein the microfracture-free portions are polished portions of the at least one scintillator crystal side surface.

12. A method, comprising:
laser etching with a laser beam at least a portion of at least one long side surface of each of a plurality of polished scintillator crystals to create a plurality of microfractures, wherein the laser etching of each crystal includes laser etching a long side surface which extends between a radiation-receiving side and a side that is optically coupled to a photodetector with progressively reduced laser intensity as the laser beam sweeps over the long side surface between the photodetector side and the radiation receiving side such that a density of the microfractures decreases progressively from the photodetector side to the radiation receiving side, wherein an amount of light scattered back into the plurality of crystals varies along a length of the long side surface; and
optically coupling a plurality of photodetectors to the plurality of scintillator crystals.

13. The method according to claim 12, wherein the laser etching step creates the microfractures underneath the surface of the scintillator crystals.

14. The method according to claim 12, further including:
designing a pattern using a computer aided design program; and
using the laser beam to laser etch the at least one long side surface with the designed pattern.

15. The method according to claim 12, wherein etching the at least one long side surface of the scintillator crystal includes laser etching a progressive pattern with progressively larger microfractured regions separated by microfracture free regions.

16. The method according to claim 12, further including:
covering each scintillator crystal with a diffuse reflective layer.

17. The method according to claim 12, further including:
laser etching a single long side surface of each scintillator crystal.

18. The method according to claim 12, further including:
converting radiation to light with the scintillator crystals;
diffusely refracting the portion of the light with the laser etched pattern;
converting at least the diffusely refracted light into an electrical signal; and
reconstructing the electrical signals into an image representation.

19. A nuclear scanner, comprising:
a plurality of scintillator crystals optically coupled to a plurality of photodetectors, the scintillator crystals each having at least one surface with progressively larger microfractured regions between a photodetector side and a radiation receiving side to diffusely reflect or refract a light back into each scintillator crystal
wherein the scintillator crystals are laser etched to create alternating microfractured regions and microfracture-free regions;
a reconstruction processor configured to reconstruct output signals from the plurality of photodetectors into an image; and
a user interface for displaying the image to a user.

* * * * *